(12) United States Patent
Chilcote et al.

(10) Patent No.: US 9,134,385 B2
(45) Date of Patent: Sep. 15, 2015

(54) MAGNETIC-FIELD SENSING DEVICE

(71) Applicants: Jason Chilcote, Morristown, NJ (US);
Richard Alan Davis, Morristown, NJ (US)

(72) Inventors: Jason Chilcote, Morristown, NJ (US);
Richard Alan Davis, Morristown, NJ (US)

(73) Assignee: Honeywell International Inc., Morristown, NJ (US)

(*) Notice: Subject to any disclaimer, the term of this patent is extended or adjusted under 35 U.S.C. 154(b) by 99 days.

(21) Appl. No.: 13/890,462

(22) Filed: May 9, 2013

(65) Prior Publication Data

US 2014/0332917 A1 Nov. 13, 2014

(51) Int. Cl.
H01L 27/22 (2006.01)
G01R 33/09 (2006.01)
G01R 33/00 (2006.01)

(52) U.S. Cl.
CPC ............ *G01R 33/09* (2013.01); *G01R 33/0052* (2013.01); *H01L 27/22* (2013.01)

(58) Field of Classification Search
None
See application file for complete search history.

(56) References Cited

U.S. PATENT DOCUMENTS

| 5,247,278 | A | 9/1993 | Pant et al. |
| 5,521,501 | A | 5/1996 | Dettmann et al. |
| 5,667,879 | A | 9/1997 | Haji-Sheikh |
| 5,820,924 | A | 10/1998 | Witcraft et al. |
| 5,952,825 | A | 9/1999 | Wan |
| 6,232,776 | B1 | 5/2001 | Pant et al. |
| 6,529,114 | B1 | 3/2003 | Bohlinger et al. |
| 6,707,293 | B2 | 3/2004 | Wan et al. |
| 6,717,403 | B2 | 4/2004 | Witcraft et al. |
| 7,423,329 | B2 | 9/2008 | Witcraft et al. |
| 2004/0004889 | A1* | 1/2004 | Asao et al. ............... 365/222 |
| 2004/0254726 | A1* | 12/2004 | Witcraft et al. ........... 701/217 |
| 2005/0205908 | A1* | 9/2005 | Fukuzumi ................ 257/295 |
| 2011/0187361 | A1 | 8/2011 | Vanhelmont et al. |

FOREIGN PATENT DOCUMENTS

EP 2450308 9/2012

* cited by examiner

Primary Examiner — Steven Loke
Assistant Examiner — Juanita B Rhodes
(74) Attorney, Agent, or Firm — Craige Thompson; Thompson Patent Law

(57) ABSTRACT

Apparatus and associated methods may relate to Magneto-Resistive Sensing Devices (MRSDs). In accordance with an exemplary embodiment, an MRSD comprises an underlying semiconductor device and a magneto-resistive sensor. In some exemplary embodiments, the semiconductor device is processed through most of a standard process flow. After the standard process flow, in various embodiments, a planarization step may be performed to create a more planar top surface. In some embodiments, the magneto-resistive material, which may be made from a Nickel-Iron alloy, called Permalloy, is deposited on the planar surface. A layer of interconnect metallization also may reside in this top region. The magneto-resistive material may contact the topmost layer of metallization of the semiconductor device via contact openings in the planarized surface. In some embodiments, the magneto-resistive material may similarly contact the topmost layer of metallization through these contact openings. The magneto-resistive material resides directly above the underlying circuitry.

16 Claims, 6 Drawing Sheets

MAGNETIC-FIELD SENSING DEVICE

TECHNICAL FIELD

Various embodiments relate generally to magneto-resistive (MR) sensors.

BACKGROUND

Magneto-Resistive Sensing Devices (MRSDs) are used to detect the presence of a magnetic field. Many of these magneto-resistive sensors are made of a material called Permalloy. Permalloy is a nickel-iron alloy. These sensors are used to detect the earth's magnetic field in compass applications. They are used to sense the proximity of a magnet, and are used in conjunction with magnets to determine rotational speeds of engines and other rotary devices. These sensors are also used to detect the stored information on disk drives of computers. Some applications of MRSDs allow a switch to be thrown by holding a magnet close to the sensor. Other applications allow a state to be set by non-contact means.

Many applications of MRSD are in portable and/or handheld devices. Such applications are often battery powered. Small device size and small device weight are both positive attributes of such instruments. Low power consumption allows such instruments to operate for long periods of time between battery charging and replacement. Furthermore, the smaller one can make the components of an instrument, the more functionality can be designed into the saved space or the instrument can be made to be smaller and lighter. Lower-power components can similarly be traded for either additional power consuming components or for longer battery life.

SUMMARY

Apparatus and associated methods may relate to Magneto-Resistive Sensing Devices (MRSDs). In accordance with an exemplary embodiment, an MRSD comprises an underlying semiconductor device and a magneto-resistive sensor. In some exemplary embodiments, the semiconductor device is processed through most of a standard process flow. After the standard process flow, in various embodiments, a planarization step may be performed to create a more planar top surface. In some embodiments, the magneto-resistive material, which may be made from a Nickel-Iron alloy, called Permalloy, is deposited on the planar surface. A layer of interconnect metallization also may reside in this top region. The magneto-resistive material may contact the topmost layer of metallization of the semiconductor device via contact openings in the planarized surface. In some embodiments, the magneto-resistive material may similarly contact the topmost layer of metallization through these contact openings. The magneto-resistive material resides directly above the underlying circuitry.

Various embodiments may achieve one or more advantages. For example, some embodiments may eliminate the need for using two separate components, a semiconductor device and a separate sensor. In another embodiment, by locating the MR sensor on the same device as the circuitry, lower power performance may be achievable. Some embodiments permit the circuit real-estate to be doubly used in this fashion, as the magneto-resistive element may be largely overlapping the underlying circuitry. In another embodiment, the location of the NiFe material is deposited on top of a semiconductor device that has many dielectric layers. These dielectric layers may permit the Fe, which may be considered a contaminant for semiconductor processing, to be isolated from the underlying circuitry by these dielectric layers. Some implementations may be advantageously constructed in part in a first facility that is substantially free of iron contamination, and then supplemented with an iron-containing magneto-resistive layer in a second manufacturing facility to eliminate possible contamination of the first facility.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 1A:
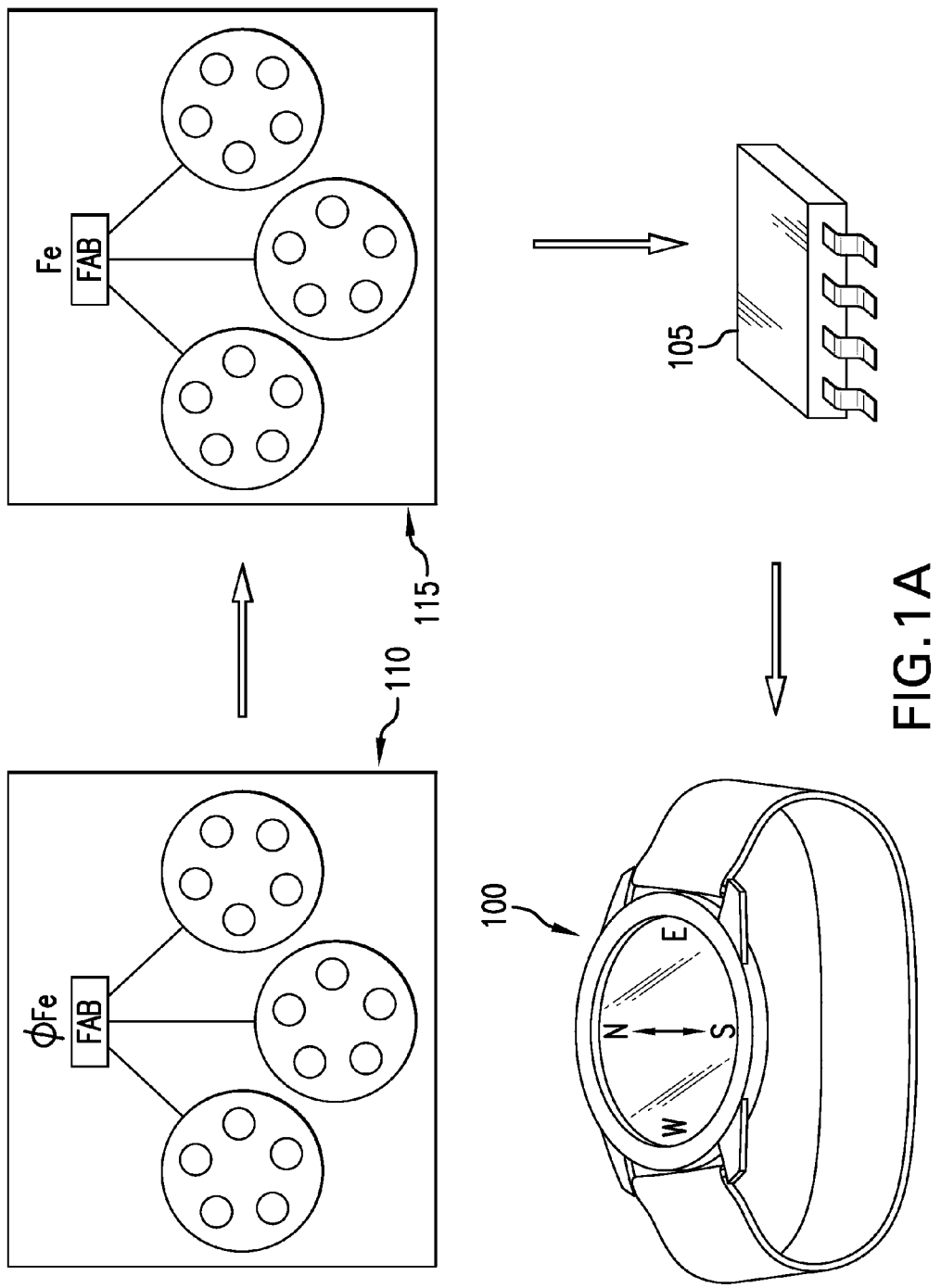
FIG. 1A depicts a schematic diagram of an exemplary manufacturing flow of a Magnetic-Field Sensing Device (MFSD) which permits the semiconductor fabrication facility to remain free of iron contamination.

FIG. 1A depicts a schematic diagram of an exemplary manufacturing flow of a Magnetic-Field Sensing Device (MFSD) which permits the semiconductor fabrication facility to remain free of iron contamination. In this figure, a watch compass 100 incorporating a packaged MFSD 105 is shown. The manufacturing of the packaged MFSD 105 was initiated in a standard microelectronics fabrication facility 110. This microelectronics fabrication facility 110 is free of iron contamination. After standard microelectronics processing, with the possible exception of top layer processes, the wafers are shipped to a magneto-resistive processing facility 115. The top-level magneto resistive processing contains steps that deposit and etch magneto-resistive materials which may include iron. The finished MFSDs can then be packaged and incorporated into consumer or industrial products such as the watch compass 100. Because the magneto-resistive processing steps are performed on top of finished or nearly finished semiconductor wafers, the magneto-resistive process steps may be performed in a separate processing facility either at the same location or at a different location. This separation of iron from the standard microelectronics processing facility permits the semiconductor processing facility to remain free of iron contamination.

Figure 1B:
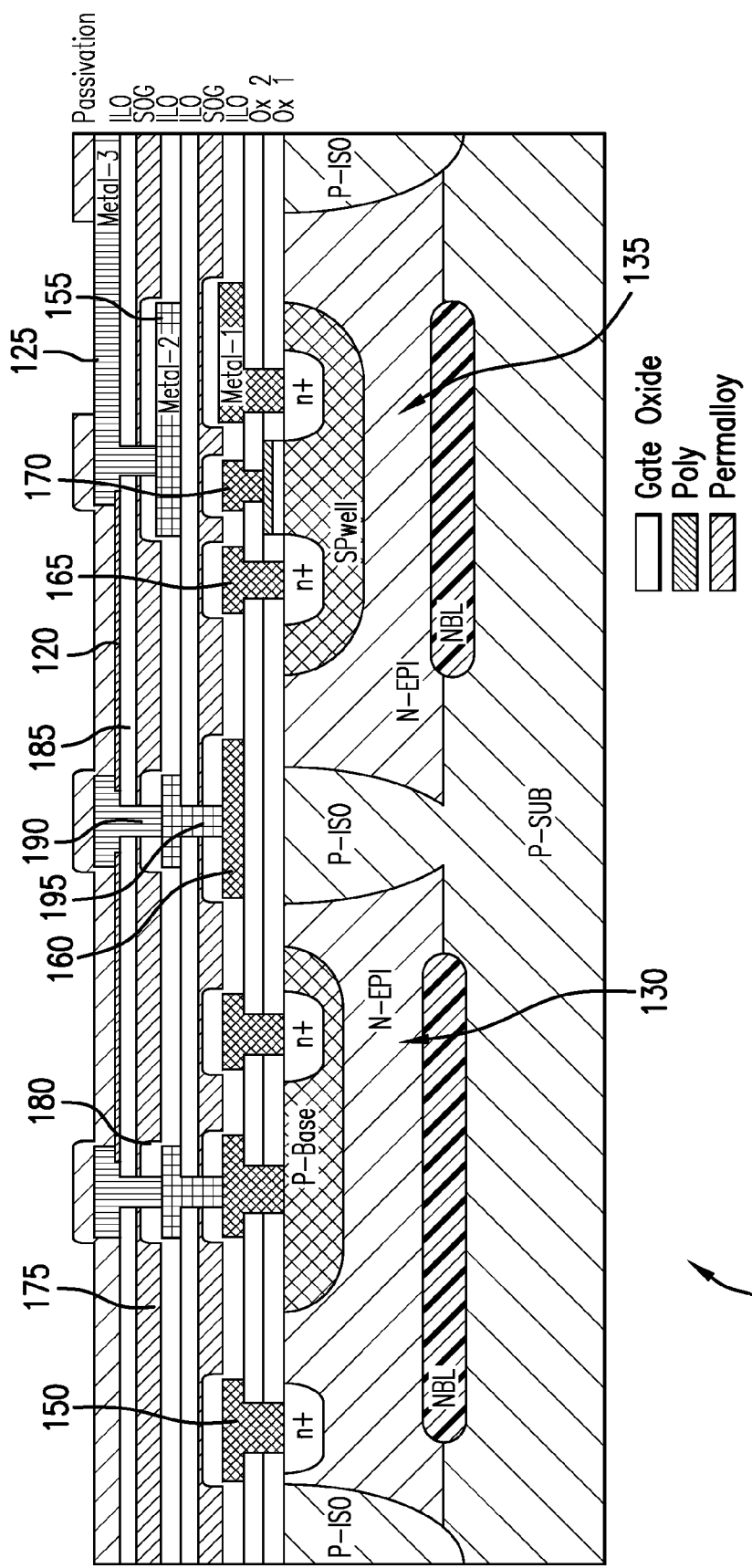
FIG. 1B depicts a cross section of an exemplary Magnetic-Field Sensing Device (MFSD).

FIG. 1B depicts a cross section of an exemplary Magnetic-Field Sensing Device (MFSD). In FIG. 1B, an exemplary portion of an MFSD is shown in cross section 102. A first region, in which the semiconductor devices reside, is shown in this example. This first region is sometimes called the "front-end" processing portion of the device. This first region may include, for example, most of the processing steps before the first layer of the metal interconnect is deposited. A second region, in which two layers of metal interconnect reside, is shown in this exemplary figure. A third region is shown to include a magneto-resistive material 120 and a layer of metallization 125, in this example. The magneto-resistive material 120 in this figure is identified in the key as "permalloy."

This figure shows two distinct semiconductor transistors. The first semiconductor transistor depicted is a vertical NPN bipolar transistor 130. The second semiconductor transistor depicted is an NMOS field-effect transistor 135. As shown in this exemplary figure, the magneto-resistive material 120 is arranged so as to be located directly above these two active devices 130, 135. Many other devices, such as resistors, capacitors, and inductors, or other transistor types can be made using appropriate geometries of the first and second regions' various layers.

This exemplary figure also depicts two layers of metallization in the second region of the device. A first layer of metallization 150 is labeled as "Metal-1" in the figure. A second layer of metallization 155 is labeled as "Metal-2" in the figure. In this example, the first layer of metal is deposited in a thin layer that is approximately parallel with the surface of region one. For example, a wire 160 is shown with an exemplary cross sectional dimension that is approximately a rectangle whose long dimension is largely parallel with the substrate. Some Metal-1 features, 165 and 170 for example, have a contact portion that descends and makes contact with the region one semiconductor devices. The second layer of metal is shown to have similar characteristics, being largely parallel to the region-one surface and having contact features. But the contact features of the second layer of metal make contact with the first layer metal in these instances.

Region three in this exemplary figure perhaps begins with the planarization layers that are above the second layer of metal 155. In this example, a layer of spin-on glass or SOG 175 has been deposited to smooth out the topographically featured surface 180, upon which the SOG resides. Another dielectric layer 185 is deposited above the SOG 175 in this exemplary cross-section. The magneto-resistive material 120 resides immediately above this dielectric layer 185. A third layer of metal interconnect 125 is then shown, and labeled as "Metal-3" in the figure. This third layer of metal has a contact 190, not too dissimilar to those of Metal-2 and Metal-1. The Metal-3 contact 190 is shown to contact a Metal-2 feature 195 located directly beneath it. In this exemplary figure, the Metal-3 directly contacts the Metal-2 in these contact features. The Metal-3 feature also contacts the magneto-resistive material everywhere that it touches it. In this way, the underlying circuitry has a way to connect to the magneto-resistive material deposited directly above the semiconductor devices.

Figure 2:
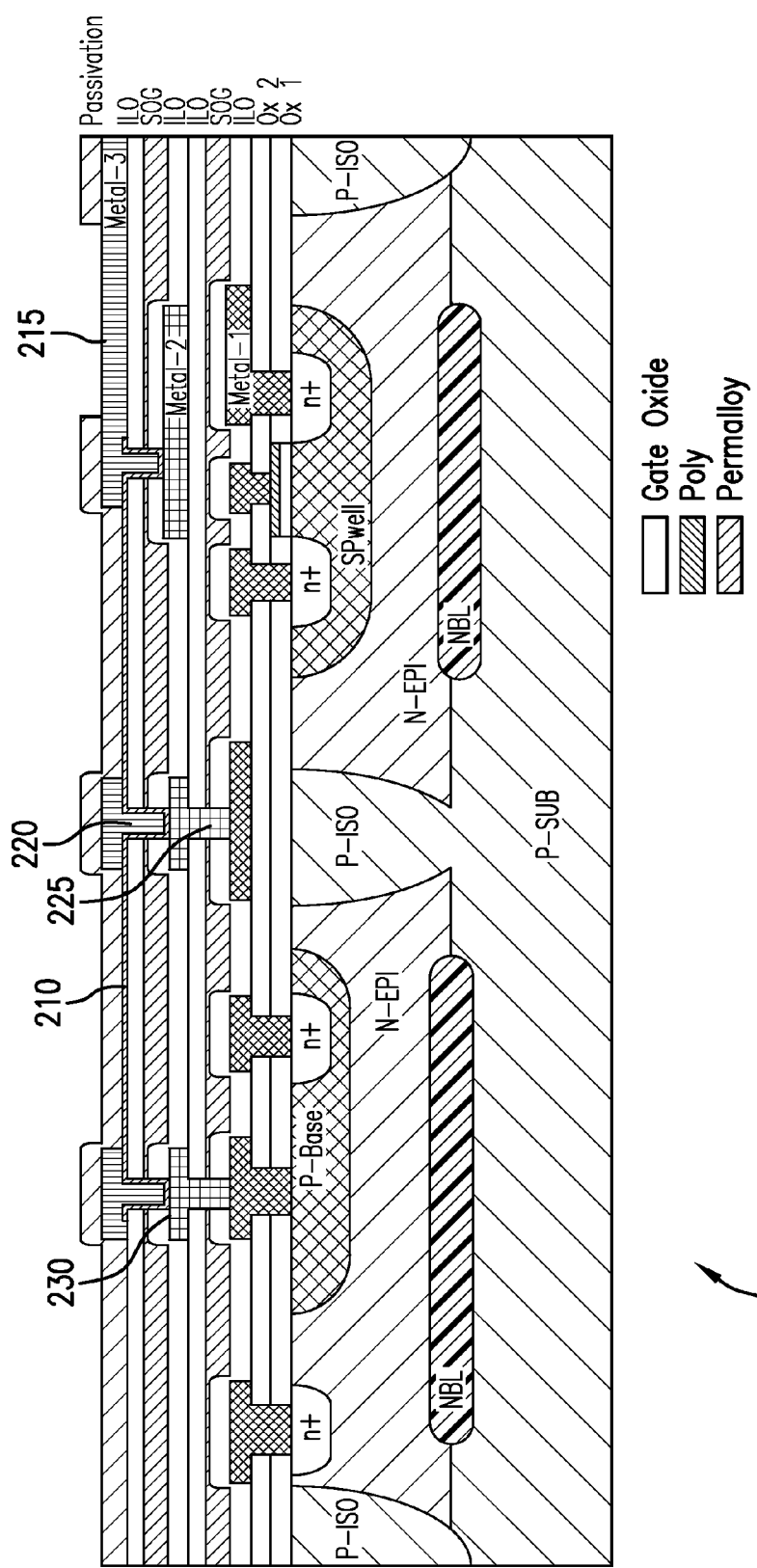
FIG. 2 depicts a cross section of an exemplary MFSD.

FIG. 2 depicts a cross section of an exemplary MFSD. This figure shows an exemplary cross-sectional view of a magnetic-field sensing device 200. In this figure, a third region is depicted. The third region is shown to have a magneto-resistive material 210 and a Metal-3 material 215. A Metal-3 contact 220 is shown to contact an underlying Metal-2 feature 225. In this exemplary figure, a contact portion 230 of the magneto-resistive material is shown to reside in the Metal-3 contact between the Metal-3 material and the Metal-2 material. In this example, the magneto-resistive material is contacted directly by the Metal-2 at such a contact. In this way, the underlying circuitry is able to connect to the magneto-resistive material that is located in the region three which is directly above the semiconductor devices.

Figure 3:
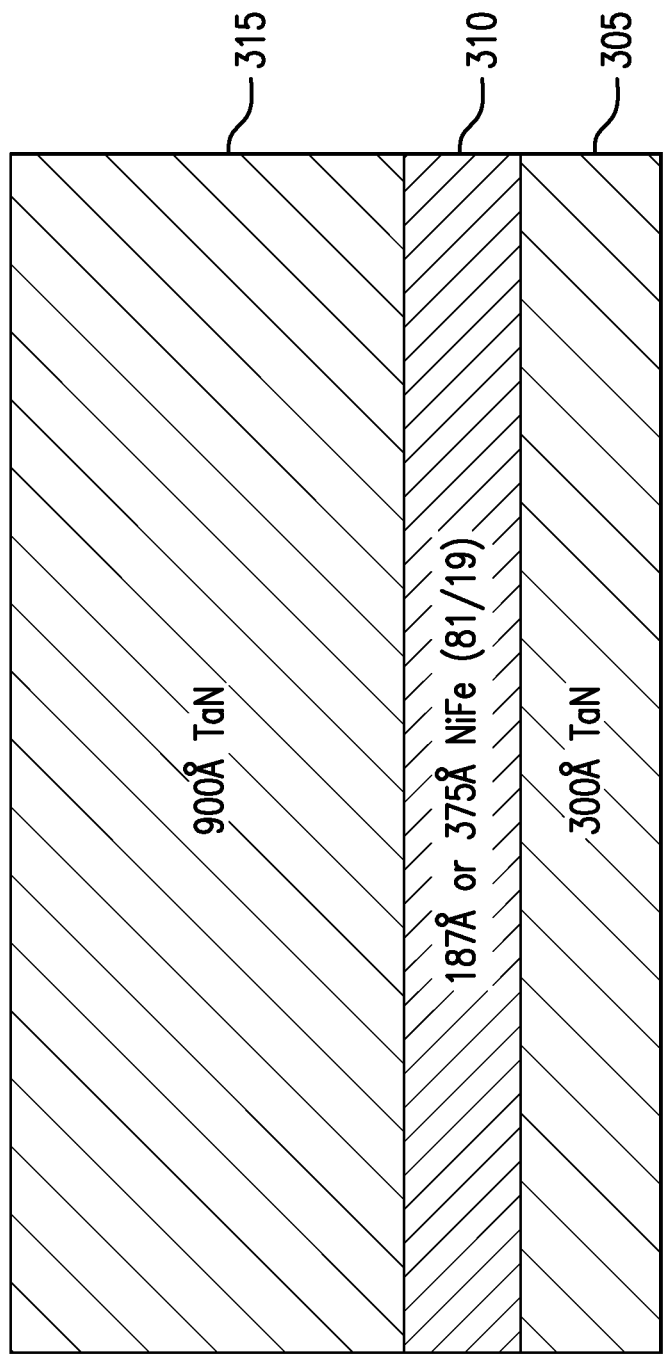
FIG. 3 depicts a cross section of an exemplary magneto-resistive material of an MFSD.

FIG. 3 depicts a cross section of an exemplary magneto-resistive material of an MFSD. In FIG. 3, a small portion of the magneto-resistive material 300 is shown in cross-section. The magneto-resistive material 300 is shown to have three layers, in this example. A bottom layer 305 is comprised of tantalum-nitride (TaN). A middle layer 310, comprising of Nickel-Iron (NiFe) in this example, is the magnetic-sensing material. A top layer 315 is comprised of TaN. The layers in this exemplary figure are shown labeled as to each of their thicknesses. In this example, the bottom TaN layer has a thickness of 300 Angstroms. The middle layer 305 is depicted with a thickness of 187 Angstroms or 375 Angstroms. The top layer 315 is shown with a thickness of 900 Angstroms. The figure also shows the relative composition of the middle layer, which is the actual magnetic-field sensing layer. In this example the NiFe layer may be composed of 81% Ni and 19% Fe. Other layer thicknesses and compositions can be used for the magneto-resistive layer. In some embodiments, for example, the NiFe layer may be composed of 90% Ni and 10% Fe. In various embodiments, the thickness of the Permalloy may be between 10 and 1000 Angstroms.

Figure 4:
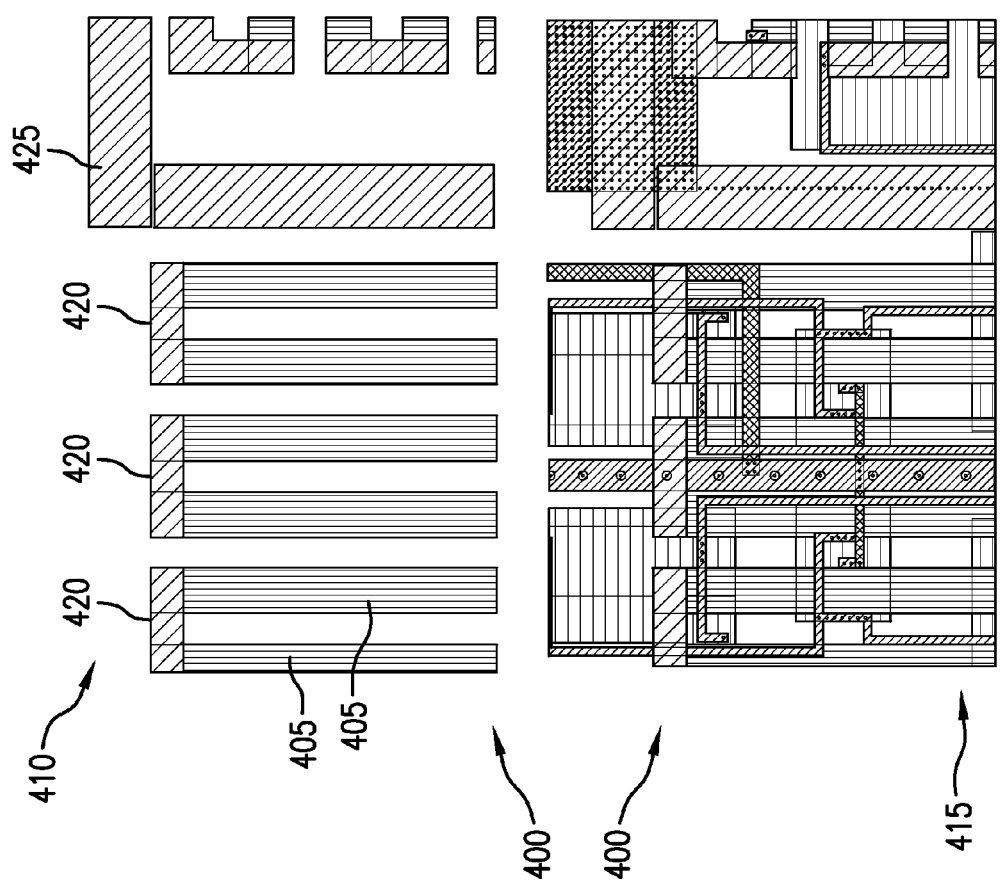
FIG. 4 depicts a plan view of an exemplary arrangement of the magneto-resistive material in relation to the underlying metal layers.

FIG. 4 depicts a plan view of an exemplary arrangement of the magneto-resistive material in relation to the underlying metal layers. In FIG. 4, an exemplary topological arrangement of layers is depicted 400. A magneto-resistive layer 405 is shown. The magneto-resistive layer 405 is shown to have a serpentine structure 410. Other such magneto-resistive topologies can be realized, such as a barber-pole structure. A second magneto-resistive structure 415 is also shown. The magneto resistive legs of the serpentine structure 410 are shown to be connected to each other via Metal-3 features 420. Therefore, in this example, Metal-3 interconnect is used to electrically connect various magneto-resistive structures together. Also a Metal-3 route 425 is depicted. Thus the Metal-3 is shown to provide additional routing capabilities.

Figure 5:
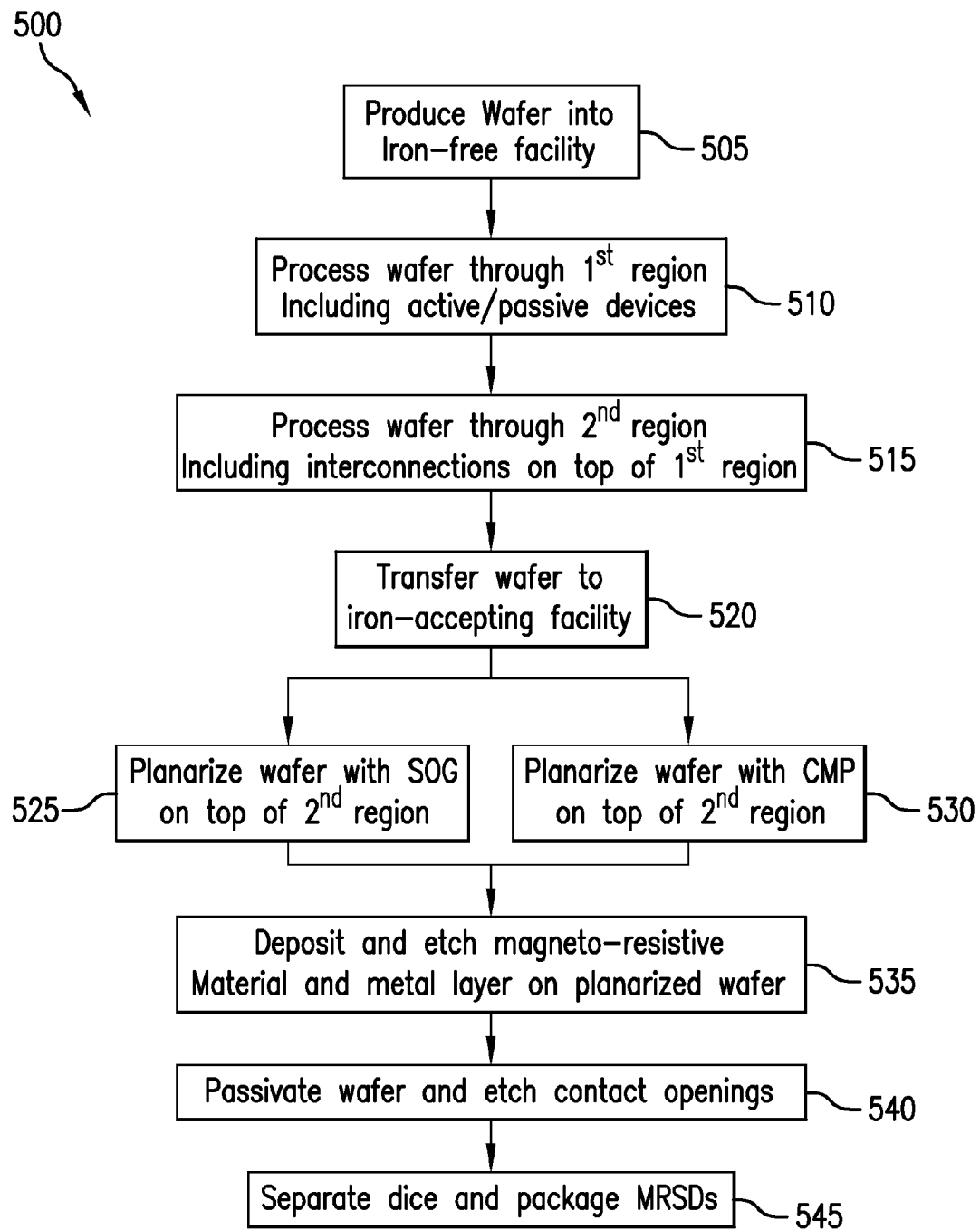
FIG. 5 depicts a flow chart of an exemplary method of manufacturing an MFSD.

FIG. 5 depicts a flow chart of an exemplary method of manufacturing an MFSD. In FIG. 5, a flow chart 500 of an exemplary method of manufacturing an MFSD is depicted. The method begins with an introduction of wafers to an iron-free facility 505. The wafers are then processed using silicon semiconductor processing techniques through a first region 510 of manufacture. This first region of manufacture includes the fabrication of the active semiconductor devices, such as FET or bipolar transistors and diodes for example, and passive devices, such as resistors, capacitors, and inductors, etc. The wafers continue to be processed through a second region of manufacture 515 which includes the deposit of one or more layers of metallization. The metallization layers of this second region are used for the electrical connection of the active and passive devices to one another, as well as the electrical connection of the resulting circuitry to other components and devices, which may include magneto-resistive devices. The metal interconnection layers and the associated intermetallic dielectric layers reside immediately above and on top of the first region devices. After the region two manufacturing has been performed, the wafers are transported to an iron accepting facility 520 for the purpose of adding magneto-resistive devices to the wafer. In this exemplary method, the planarization of the wafer is performed in the iron-accepting facility, but such planarization methods may similarly be performed in the iron-free facility before wafer transfer. Two exemplary methods of planarization are depicted: Spin-On Glass (SOG) planarization 525 and Chemical-Mechanical Polishing (CMP) planarization 530. Other methods, such as resistive etch-back planarization could also be performed. After planarization and dielectric deposit is performed, Permalloy or the magneto-resistive layer may be deposited as well as another layer of metallization 535. After depositing and etching these layers, a final passivation and etching of contact openings is performed 540 in this exemplary process. Finally, the dice are cut and packaged 545 for use in a product.

Many ways exist to electrically connect the interconnecting electrical paths in the second region to the magneto-resistive material in the third region. In some embodiments, the magneto-resistive layer may be connected to the underlying metal interconnections by first etching via in the dielectric layers intervening between the top-most layer of region-two metallization and then depositing the magneto-resistive material such that it makes physical contact with the top-most layer of region-two metallization in the etched contact regions. In other embodiments, the magneto-resistive material may be electrically connected to the top-most layer of region-two metallization by way of an additional layer of metallization. In such embodiments, for example, after the contacts have been etched to the top-most layer of region-two metallization, a layer of magneto-resistive material may be deposited. This magneto-resistive material may then be selectively removed by an etch step. Then another layer of metallization may be deposited. This metallization may then connect to both the un-etched magneto-resistive material and the top-layer of region-two metallization exposed in the contacts that were previously etched in the intervening dielectric materials. Other permutations of the above steps may also be performed to provide the electrical connection of the magneto-resistive material to the underlying metal interconnect layers. For example, the last metal deposition and magneto-resistive deposition may be transposed so that the top-layer of metallization is first deposited and etched, and then the magneto-resistive layer may be deposited and then etched. In this way, the magneto-resistive layer may be connected via the metal deposited immediately before the magneto-resistive layer's deposition.

Although various embodiments have been described with reference to the Figures, other embodiments are possible. For example, many different processing techniques exist to create the semiconductor devices. Some processes have, for example, heterojunction bipolar devices. A third region, containing the magneto-resistive material, could be applied to a wide variety of underlying semiconductor devices, including for example the heterojunction bipolar device process described.

In various embodiments, the MRSD may be manufactured using alternate magneto-resistive materials and/or compositions. In an exemplary embodiment, a NiFe layer may be thinner or thicker. In another embodiment, the Fe concentration may be greater than 19% or less than 19%. Such changes in composition and thickness may have desirable circuit consequences regarding response to a magnetic field or regarding circuit power consumption. In accordance with another embodiment, the TaN cladding layers may be composed of different chemical compositions. TiN or other refractory metal nitrides may be used for example. In another exemplary embodiment, the cladding layer thicknesses may be smaller or greater. Such thicknesses may be selected, for example, to provide for better step coverage over surface topologies.

In accordance with another embodiment, planarization may be performed using methods other than SOG. For example, in one exemplary embodiment Chemical Mechanical Polishing (CMP) may be used instead of SOG or in addition to SOG. Other planarization methods using anisotropic etch-back techniques may also be used either in addition to SOG and CMP or in lieu of SOG or CMP. In some exemplary embodiments, the metal-3 layer of the third region may be deposited, patterned and etched before the magneto-resistive layer is deposited.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A magnetic-field sensing device, comprising:
    a first region, comprising semiconductor devices on a substrate;
    a second region disposed on the first region, comprising at least two vertically separated layers of interconnecting electrical paths; and
    a third region disposed on the second region and comprising a magneto-resistive material disposed to vertically overlap and arranged in electrical communication with the semiconductor devices in the first region via the interconnecting electrical paths in the second region, wherein the first and second regions are separated by a first dielectric layer and the second and third regions are separated by a second dielectric layer,
    wherein electrical communication between the magneto-resistive material and the semiconductor devices comprises one or more vias in the third dielectric layer, each of the one or more vias having sidewalls and a bottom aperture exposing a top surface of underlying metal,
    wherein the magneto-resistive material is disposed to contiguously cover an entirety of the each of the one or more vias' sidewalls and contacting an entirety of the top surface of the underlying metal exposed by the via.

2. The device of claim 1, wherein the second region comprises at least three vertically separated layers of interconnecting electrical paths.

3. The device of claim 1, wherein the semiconductor devices in the first region comprise CMOS transistors.

4. The device of claim 1, wherein the semiconductor devices in the first region comprise bipolar transistors.

5. The device of claim 1, wherein the semiconductor devices in the first region comprise both CMOS transistors and bipolar transistors.

6. The device of claim 1, wherein the magneto-resistive material of the third region comprises Permalloy material.

7. The device of claim 1, wherein the third region further comprises a layer of metal disposed to provide electrical connection to a topmost metal layer of the second region and to the magneto-resistive material of the third region.

8. The device of claim 1, wherein the magneto-resistive material of the third region overlaps more than fifty percent of the underlying first region comprising semiconductor devices.

9. A magnetic-field sensing device comprising:
    a first region comprising semiconductor devices on a substrate;
    a second region disposed on the first region, the second region comprising interconnecting electrical paths; and
    a third region disposed on the second region and comprising a magneto-resistive (MR) material disposed to vertically overlap the semiconductor devices in the first region, wherein the first and second regions are separated by a first dielectric layer and the second and third regions are separated by a second dielectric layer, and further comprising an additional MR material extending vertically between and making intimate physical contact between the MR material in the third region and a plurality of conductive portions of the interconnecting electrical path in the second region, wherein intimate physical contact between the MR material in the third region and the plurality of conductive portions of the interconnecting electrical path in the second region comprises vias in the second dielectric layer, each of the vias having sidewalls and a bottom aperture exposing a top surface of underlying metal, wherein the additional MR material is disposed to contiguously cover an entirety of each of the vias' sidewalls and contacting an entirety of the top surface of the underlying metal exposed by the via.

10. The device of claim 9, wherein the second region comprises at least three vertically separated layers of interconnecting electrical paths.

11. The device of claim 9, wherein the semiconductor devices in the first region comprise CMOS transistors.

12. The device of claim 9, wherein the semiconductor devices in the first region comprise bipolar transistors.

13. The device of claim 9, wherein the semiconductor devices in the first region comprise both CMOS transistors and bipolar transistors.

14. The device of claim 9, wherein the magneto-resistive material of the third region comprises Permalloy material.

15. The device of claim 9, wherein the third region further comprises a layer of metal disposed to provide electrical connection to a topmost metal layer of the second region and to the magneto-resistive material of the third region.

16. The device of claim 9, wherein the magneto-resistive material of the third region overlaps more than fifty percent of the underlying first region comprising semiconductor devices.

* * * * *